Nov. 3, 1970 J. LE CARPENTIER 3,537,920

PROCESS FOR THE PRODUCTION OF DIODES BY ELECTRIC PULSES

Filed April 5, 1968

United States Patent Office 3,537,920
Patented Nov. 3, 1970

3,537,920

PROCESS FOR THE PRODUCTION OF DIODES BY ELECTRIC PULSES

Jacques Le Carpentier, Urville Naqueville, France, assignor to C.I.T. Compagnie Industriell des Telecommunications, Paris, France, a corporation of France Filed Apr. 5, 1968, Ser. No. 719,024
Claims priority, application France, Apr. 18, 1967, 103,229
Int. Cl. H01l 7/48
U.S. Cl. 148—179 7 Claims

ABSTRACT OF THE DISCLOSURE

Process for the production of semiconductor elements consisting in depositing on one of the faces of an N-type or P-type semiconductor substrate a layer of an insulating material in which there are formed apertures which may have the same or different dimensions, and then covering these apertures and the immediately adjacent area thereof with a doping material of opposite conductivity type to the substrate, the conductive areas thus formed being insulated from one another, and thereafter individually and successively subjecting the conductive areas to electric pulses.

The present invention relates to a process for producing on one substrate semiconductor elements, notably tunnel-effect or uni-tunnel diodes, since it is in this case that the invention appears to have its more important application.

The known processes for the production of such diodes do not make it possible to produce on the same substrate without chemical or electrolytic surface cleaning, diodes having well-defined characteristics. It is necessary to separate each diode and to treat it individually in order to impart the desired characteristics thereto, which is an obstacle to mass production. The present invention accordingly concerns a process which obviates these disadvantages.

The present invention, which concerns a process for the production of a plurality of diodes on a common substrate, is characterized by the following combination of steps: there is deposited upon one of the faces of an N-type or P-type semiconductor substrate a layer of an insulating material in which there are formed apertures which may have different dimensions and which are sufficiently deep to expose zones of the semiconductor substrate; the said apertures or windows in the insulation thereafter are covered internally and in their immediate neighborhoods by a doping material of opposite conductivity type to the substrate; the conductive areas thus formed, which are insulated from one another, are then individually and successively subjected to electric pulses supplied by a generator, whose output electrodes are disposed, one upon the crystal and the other in the interior of the window on the conductive layer.

Such a process makes it possible to obtain diodes, notably tunnel and uni-tunnel diodes, with a number of advantages. For example, it makes it possible to individually and successively form the diodes on the substrate without modifying the electrical characteristics of the neighboring semiconductor elements already formed, with a precision which may be better than 1% on the peak current, without any necessity to effect a surface cleaning. It is possible to form on a common substrate semiconductor elements such as tunnel diodes and uni-tunnel diodes which have similar or different characteristics, the said elements also affording advantageous possibilities of connection for their integration in hybrid circuits, or for their encapsulation in a common casing when different elements are produced on a common substrate which may serve as a support.

Further features of the invention will become apparent from the detailed description of the serial production, on a common substrate, of tunnel or uni-tunnel diodes, with reference to the accompanying drawings, in which:

FIG. 1 illustrates a first stage in the production of tunnel diodes; the monocrystalline or polycrystalline substrate 1 may consist of germanium, silicon, gallium arsenide or any other element highly doped to form an N-type or P-type semiconductor element. On this base material is deposited a layer of insulating material 2, for example silicon dioxide.

Figure 1:
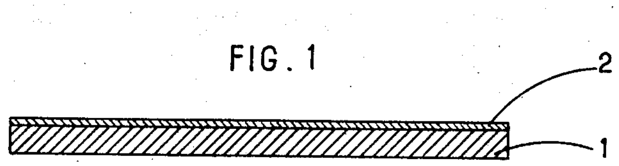
FIGS. 1 to 4 illustrate various stages in the production of tunnel diodes according to the invention.
Figure 2:
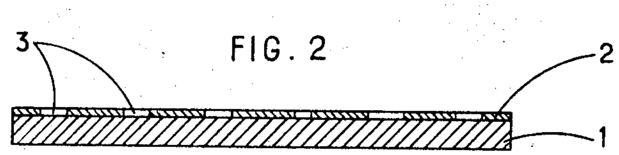

FIG. 2 illustrates the next stage in the process, in which apertures or windows 3 are formed in the insulating layer 2, so that direct access to the substrate is afforded through these apertures. The apertures are formed by any appropriate means, for example by the use of photo-resistive or masking products; the apertures need not all be of the same dimensions, depending upon the characteristics of the diodes which it is desired to obtain.

Figure 3:
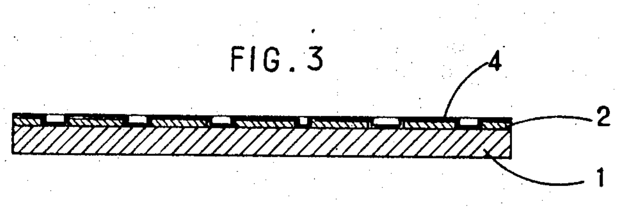

FIG. 3 illustrates the phase of production in which a doping substance 4 of opposite conductivity type to the substrate, for example aluminum in the case of an N-type substrate, has been deposited over the entire insulating external face, with the thickness of the insulating layer, in the apertures and on the substrate itself, through the apertures. This thin aluminum deposit may be produced by any appropriate method, for example by vacuum evaporation.

Figure 4:
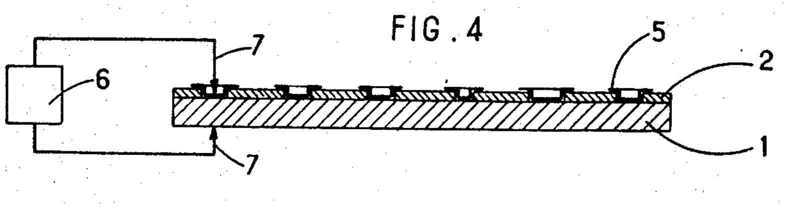

In FIG. 4, the aluminum has been left only in the apertures and on the surface of insulating layer 2 only in the immediate neighborhood of the apertures in the case here taken by way of example. There are thus obtained conductive areas 5 which are electrically insulated from one another, as seen in FIG. 5.

For the formation of the diodes, the two electrodes 7 of a pulse generator 6 are applied between each conductive area 5 and the substrate 1; the electric pulses applied from the generator, which may be controlled, produce the alloying of the doping material 4 and the semiconductor material 1 by heating confined to the area under consideration; the operation is repeated for each diode. The formation of each tunnel or uni-tunnel diode is independent of the diodes already formed. Diodes having precise characteristics may be obtained by the choice of electric pulses of appropriate amplitude, width and shape.

Figure 5:
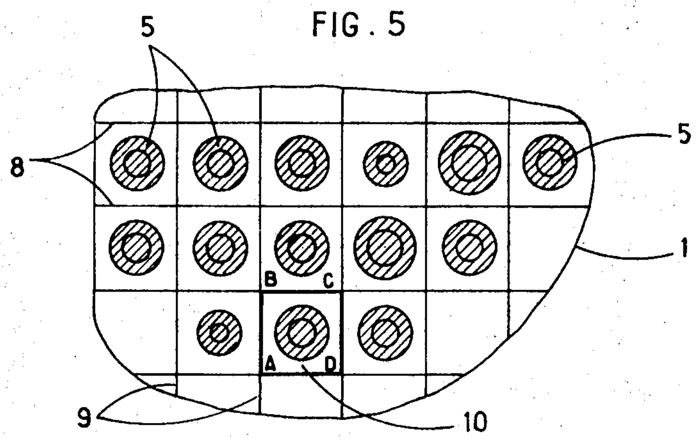
FIG. 5 is a plan view of a crystal in which a number of diodes have been formed.

FIG. 5 illustrates the principle of the separation of the diodes obtained on a common substrate 1. The crystal wafer 1 is scored by means of a diamond and it is cut up by a conventional method. There is obtained for each diode a small square 10, such as ABCD, which will thereafter be mounted on a base, to which the terminals are secured by thermocompression or by any other method.

This particular description of the formation of diodes has been given only by way of example, and it is obvious that, depending upon the type of semiconductor elements produced, the nature of the substrate, of the doping material and of the electric pulses, it may vary without departing from the scope of the invention.

The invention also concerns the products produced by the above process.

I claim:

1. Process for the production of semiconductor diodes comprising the steps of forming a dual layer element consisting of a semiconductor layer and an insulator layer having a plurality of apertures therein positioned on one surface of said semiconductor layer, depositing in said apertures a doping conductive material of an opposite conductivity type to said semiconductor layer so that the conductive areas formed are insulated from one another, and applying individually and successively across each of said conductive areas and said semiconductor layer an electric pulse so as to form diode junctions therebetween.

2. Process according to claim 1 wherein said step of forming a dual layer element includes uniformly depositing a layer of an insulating material on one of the faces of a semiconductor substrate and then forming apertures in the layer of insulating material by removing portions thereof to expose the semiconductor substrate.

3. Process according to claim 1 wherein said step of forming a dual layer element consists of depositing a layer of an insulating material selectively on one of the faces of a semiconductor substrate so as to leave portions thereof exposed.

4. Process according to claim 1 wherein said step of depositing doping conductive material in said apertures includes depositing doping conductive material over the entire surface of said insulator layer and removing portions of said doping conductive material so as to leave said material only in the apertures and the area immediately adjacent thereto.

5. Process according to claim 1 including the further step of cutting said dual layer element so as to form separate diode junctions.

6. Process according to claim 1 wherein said doping conductive material is aluminum.

7. Process according to claim 1 wherein the amplitude, width and shape of said electric pulse is varied for application across different conductive areas.

References Cited

UNITED STATES PATENTS

| | | | |
|---|---|---|---|
| 3,156,592 | 11/1964 | Zuleeg | 148—183 |
| 3,291,658 | 12/1966 | Butler et al. | 148—183 |

RICHARD O. DEAN, Primary Examiner

U.S. Cl. X.R.

148—180, 183